US009060430B1

(12) United States Patent
Huemoeller et al.

(10) Patent No.: US 9,060,430 B1
(45) Date of Patent: Jun. 16, 2015

(54) SHIELDED TRACE STRUCTURE AND FABRICATION METHOD

(75) Inventors: Ronald Patrick Huemoeller, Chandler, AZ (US); Sukianto Rusli, Phoenix, AZ (US); Nozad Karim, Chandler, AZ (US)

(73) Assignee: AMKOR TECHNOLOGY, INC.

( * ) Notice: Subject to any disclaimer, the term of this patent is extended or adjusted under 35 U.S.C. 154(b) by 420 days.

(21) Appl. No.: 12/924,918

(22) Filed: Oct. 8, 2010

Related U.S. Application Data

(62) Division of application No. 12/018,435, filed on Jan. 23, 2008, now Pat. No. 7,832,097.

(51) Int. Cl.
| | |
|---|---|
| *H01K 3/10* | (2006.01) |
| *H05K 3/02* | (2006.01) |
| *H05K 3/00* | (2006.01) |
| *H05K 3/10* | (2006.01) |

(52) U.S. Cl.
CPC .............. *H05K 3/027* (2013.01); *H05K 3/0026* (2013.01); *Y10T 29/49167* (2015.01); *H05K 3/108* (2013.01)

(58) Field of Classification Search
CPC ..................... H01L 21/76877; H01L 21/3213; H01L 23/485; H01L 23/481; H01L 23/535; H05K 1/111; H05K 1/112; H05K 1/115; H05K 1/116; H05K 3/0026; H05K 3/027; H05K 3/061; H05K 3/107; H05K 3/108; H05K 3/4084; Y10T 29/49167
USPC ............ 29/846, 852, 853, 847, 832; 174/251, 174/261–264; 438/126, 622
See application file for complete search history.

(56) References Cited

U.S. PATENT DOCUMENTS

| | | | |
|---|---|---|---|
| 5,287,619 A * | 2/1994 | Smith et al. ..................... 29/852 |
| 6,035,527 A | 3/2000 | Tamm | |
| 6,121,129 A * | 9/2000 | Greco et al. .................. 438/622 |
| 6,187,660 B1 | 2/2001 | Gardner | |
| 6,194,250 B1 | 2/2001 | Melton et al. | |
| 6,410,457 B1 * | 6/2002 | M'Saad et al. ................ 438/778 |
| 6,730,857 B2 | 5/2004 | Konrad et al. | |
| 6,740,964 B2 | 5/2004 | Sasaki | |
| 6,919,514 B2 | 7/2005 | Konrad et al. | |

(Continued)

OTHER PUBLICATIONS

Scanlan, "Package-on-package (PoP) with Through-mold Vias", *Advanced Packaging*, Jan. 2008, 3 pages, vol. 17, Issue 1, PennWell Corporation.

(Continued)

*Primary Examiner* — Peter DungBa Vo
*Assistant Examiner* — Jeffrey T Carley
(74) *Attorney, Agent, or Firm* — McAndrews, Held & Malloy, Ltd.

(57) ABSTRACT

A method includes forming a patterned sacrificial layer on a first carrier and a patterned trace layer on the patterned sacrificial layer. The patterned sacrificial layer and the patterned trace layer are laminated to a dielectric material. The first carrier and the patterned sacrificial layer are removed creating sacrificial layer gaps above the patterned trace layer. The sacrificial layer gaps are filled with a trace layer isolation dielectric material. Shield trenches are laser-ablated within the dielectric material and on opposite sides of a signal trace of the patterned trace layer. The shield trenches are filled with an electrically conductive material to form shield walls. The electrically conductive material is patterned to form a shield top. The shield top, the shield walls, and a second carrier form a bias shield around the signal trace.

20 Claims, 13 Drawing Sheets

(56) References Cited

U.S. PATENT DOCUMENTS

| | | |
|---|---|---|
| 7,242,081 B1 | 7/2007 | Lee |
| 7,345,361 B2 | 3/2008 | Mallik et al. |
| 7,372,151 B1 | 5/2008 | Fan et al. |
| 7,589,398 B1 | 9/2009 | Huemoeller et al. |
| 7,777,351 B1 | 8/2010 | Berry et al. |
| 2002/0195270 A1* | 12/2002 | Okubora et al. ............ 174/260 |
| 2006/0124345 A1 | 6/2006 | Asami et al. |
| 2007/0273049 A1 | 11/2007 | Khan et al. |
| 2007/0290376 A1 | 12/2007 | Zhao et al. |
| 2008/0230887 A1 | 9/2008 | Sun et al. |

OTHER PUBLICATIONS

Kim et al., "Application of Through Mold Via (TMV) as PoP base package", 58$^{th}$ *ECTC Proceedings*, May 2008, Lake Buena Vista, FL, 6 pages, IEEE.

\* cited by examiner

SHIELDED TRACE STRUCTURE AND FABRICATION METHOD

This application is a divisional of Huemoeller et al., U.S. patent application Ser. No. 12/018,435, filed on Jan. 23, 2008, entitled "SHIELDED TRACE STRUCTURE AND FABRICATION METHOD", now U.S. Pat. No. 7,832,097, issued on Nov. 16, 2010, which is herein incorporated by reference in its entirety.

BACKGROUND OF THE INVENTION

1. Field of the Invention

The present invention relates generally to substrates for mounting of electronic components and the resulting packages. More particularly, the present invention relates to a method of fabricating a shielded trace substrate and the resulting structures.

2. Description of the Related Art

As the electronic arts have moved to smaller and lighter weight devices, the width of signal traces has been reduced while at the same time the number of signal traces has increased for a given substrate. However, this means electrical properties, such as impedance, must be more accurately controlled.

SUMMARY OF THE INVENTION

In accordance with one embodiment, a method includes forming an embedded bias-signal trace structure. The bias-signal trace structure includes a dielectric layer, a first embedded bias trace embedded within the dielectric layer, and an embedded signal trace embedded within the dielectric layer. A buildup dielectric layer is mounted to the embedded bias-signal trace structure. A bias via aperture is formed within the buildup dielectric layer, the bias via aperture extending entirely through the buildup dielectric layer. The bias via aperture is filled with an electrically conductive material to form a bias via, the bias via being electrically connected to the first embedded bias trace.

The bias via aperture is formed where a bias via is electrically desired and/or where a bias via is determined by electrical simulations to reduce noise. In this manner, bias vias are created at critical junctions to reduce noise on power return paths. Further, formation of a ground plane layer is avoided further reducing noise and minimizing fabrication cost. This also enables high frequency signal propagation without formation of a ground plane layer.

In accordance with another embodiment, a method includes forming a patterned sacrificial layer on a first carrier. A patterned trace layer is formed on the patterned sacrificial layer. The patterned sacrificial layer and the patterned trace layer are laminated to a dielectric material. The first carrier is removed. The patterned sacrificial layer is also removed creating sacrificial layer gaps above the patterned trace layer. The sacrificial layer gaps are filled with a trace layer isolation dielectric material. Shield trenches are laser-ablated within the dielectric material and on opposite sides of a signal trace of the patterned trace layer. The shield trenches are filled with an electrically conductive material to form shield walls. The electrically conductive material is patterned to form a shield top.

The shield top, the shield walls, and a second carrier form a bias shield around the signal trace. The bias shield is electrically connected to a reference voltage source, e.g., ground or power. Accordingly, signals propagated on the signal trace are shielded by the bias shield.

In this manner, noise, signal attenuation, and signal coupling to non-critical planes, on the signal trace is minimized enabling high frequency signal propagation on the signal trace without addition of a ground layer. Further, impedance of the signal trace is carefully controlled.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
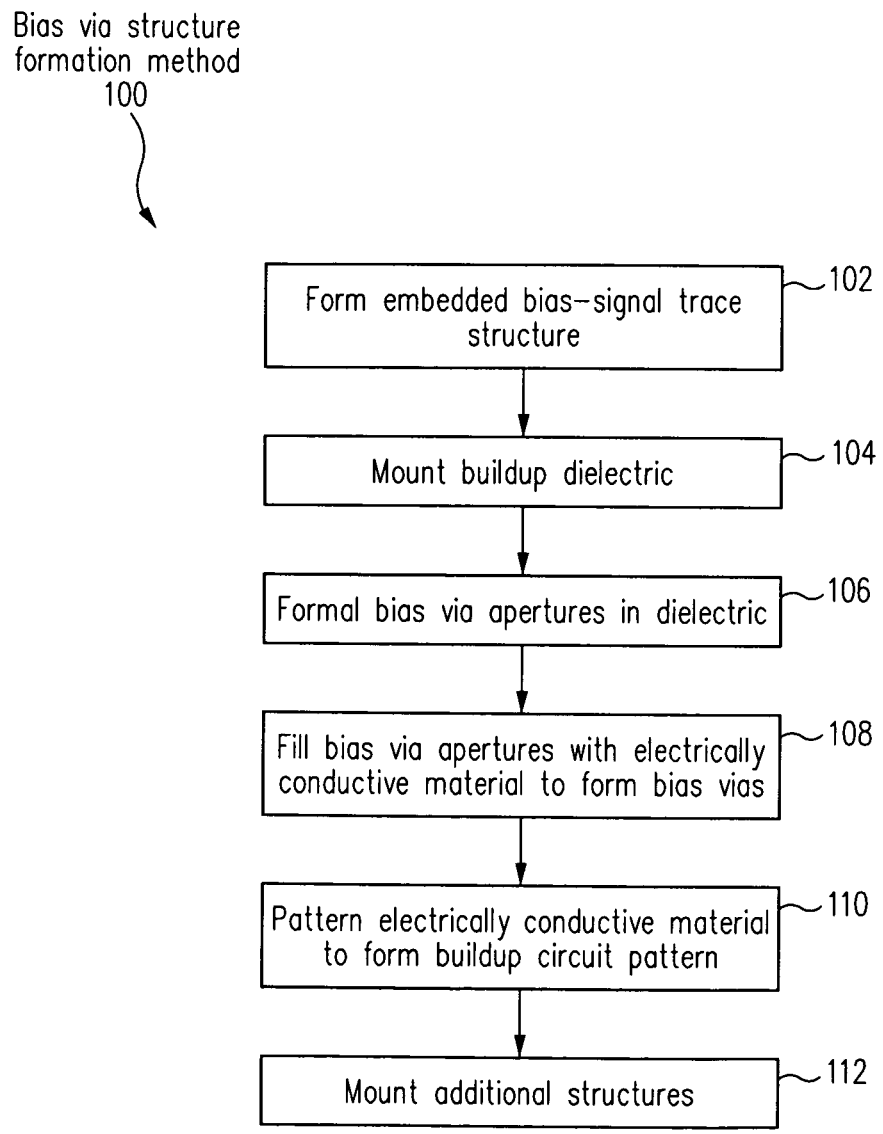
FIG. 1 is a bias via structure formation method in accordance with one embodiment of the present invention.
Figure 2:
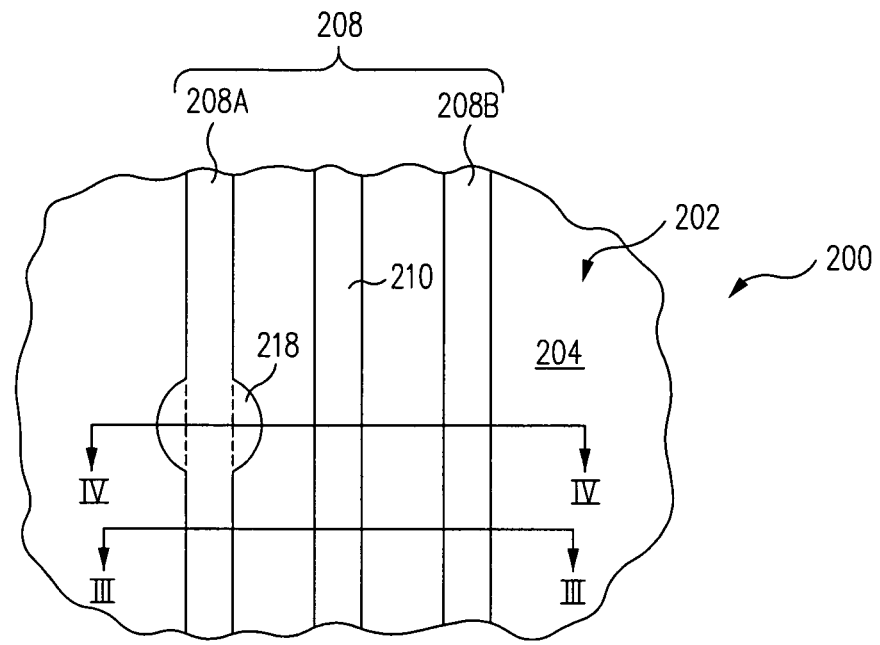
FIG. 2 is a top plan view of a package during fabrication in accordance with one embodiment.

FIG. 1 is a bias via structure formation method 100 in accordance with one embodiment of the present invention. FIG. 2 is a top plan view of a package 200 during fabrication in accordance with one embodiment.

Figure 3:
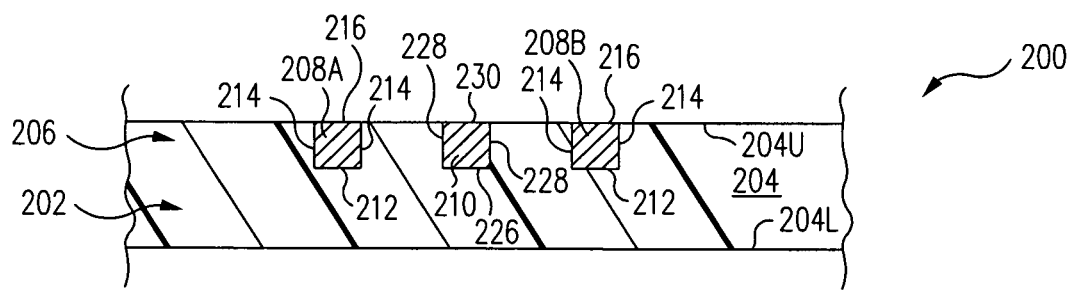
FIG. 3 is a cross-sectional view of the package along the line of FIG. 2.
Figure 4:
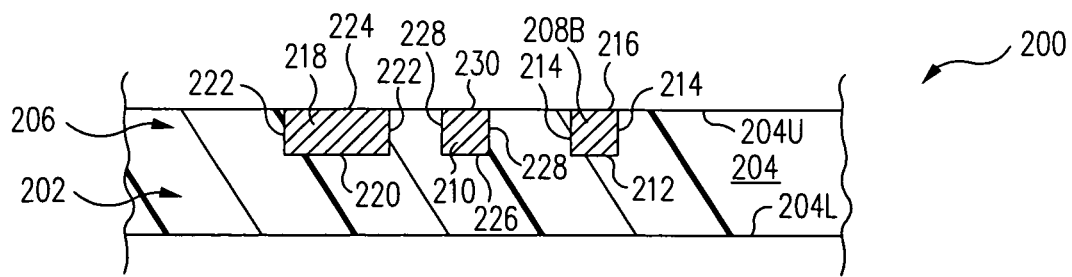
FIG. 4 is a cross-sectional view of the package along the line IV-IV of FIG. 2.

FIG. 3 is a cross-sectional view of package 200 along the line of FIG. 2. FIG. 4 is a cross-sectional view of package 200 along the line IV-IV of FIG. 2.

Referring now to FIGS. 1, 2, 3 and 4 together, in a form embedded bias-signal trace structure operation 102, an embedded bias-signal trace structure 202 is formed. Embedded bias-signal trace structure 202 includes a dielectric layer 204 and an embedded circuit pattern 206 embedded within dielectric layer 204.

In one embodiment, dielectric layer 204 is made of any of the numerous substrate materials known to those of skill in the art such as Prepreg, or any other primarily dielectric material. Dielectric layer 204 includes an upper, e.g., first, surface 204U and a lower, e.g., second, surface 204L opposite upper surface 204U.

Embedded circuit pattern 206 includes a first embedded bias trace 208A, a second embedded bias trace 208B, and an embedded signal trace 210. Embedded bias trace 208A and embedded bias trace 208B are collectively referred to as embedded bias traces 208.

Although embedded circuit pattern 206 is illustrated and discussed herein as including embedded bias traces 208 and embedded signal trace 210, in other embodiments, embedded circuit pattern 206 includes a plurality of bias traces and signal traces such as those set forth in Huemoeller et al., U.S. patent application Ser. No. 11/543,540, filed on Oct. 4, 2006, entitled "METHOD AND STRUCTURE FOR CREATING EMBEDDED METAL FEATURES", which is herein incorporated by reference in its entirety. Further, although embedded circuit pattern 206 is illustrated as a single layer conductor, in other embodiments, embedded circuit pattern 206 is a multi-layer structure, e.g., includes an electrically conductive seed layer and an electrically conductive material plated on the seed layer.

In one embodiment, embedded bias traces 208 and embedded signal trace 210 extends horizontally and in a direction parallel with upper surface 204U of dielectric material 204 as illustrated in FIG. 2. Embedded bias traces 208 and embedded signal trace 210 are embedded within dielectric layer 204 at upper surface 204U.

To illustrate, embedded bias traces 208 include bias trace bases 212 recessed below upper surface 204U of dielectric material 204. Stated another way, bias trace bases 212 are between a plane defined by upper surface 204U of dielectric material 204 and a plane defined by lower surface 204L of dielectric material 204 such that dielectric material 204 remains between bias trace bases 212 and lower surface 204L of dielectric material 204.

Bias traces 208 further include bias trace sidewalls 214 and bias trace primary surfaces 216. Bias trace sidewalls 214 extend between bias trace bases 212 and bias trace primary surfaces 216. Bias trace primary surfaces 216 are coplanar with upper surface 204U of dielectric material 204.

In accordance with this example, embedded circuit pattern 206 includes an embedded land 218 electrically connected to embedded bias trace 208A. Embedded land 218 includes a land base 220 recessed below upper surface 204U of dielectric material 204. Stated another way, land base 220 is between a plane defined by upper surface 204U of dielectric material 204 and a plane defined by lower surface 204L of dielectric material 204 such that dielectric material 204 remains between land base 220 and lower surface 204L of dielectric material 204.

Embedded land 218 further includes a land sidewall 222 and a land primary surface 224. Land sidewall 222 extends between land base 220 and land primary surface 224. Land primary surface 224 is coplanar with upper surface 204U of dielectric material 204. Generally, embedded land 218 has a greater width than embedded bias trace 208A facilitating electrical connection of a bias via therewith as discussed further below. However, embedded land 218 is optional and in one embodiment is not formed such that the bias via is directly electrically connected to embedded bias trace 208A.

Embedded signal trace 210 include a signal trace base 226 recessed below upper surface 204U of dielectric material 204. Stated another way, signal trace base 226 is between a plane defined by upper surface 204U of dielectric material 204 and a plane defined by lower surface 204L of dielectric material 204 such that dielectric material 204 remains between signal trace base 226 and lower surface 204L of dielectric material 204.

Embedded signal trace 210 further includes signal trace sidewalls 228 and a signal trace primary surface 230. Signal trace sidewalls 228 extend between signal trace base 226 and signal trace primary surface 230. Signal trace primary surface 230 is coplanar with upper surface 204U of dielectric material 204.

In one embodiment, embedded bias traces 208 are electrically connected to a reference voltage source, e.g., to ground or power. Accordingly, bias traces are biased with an electrical potential, such as ground or power. According, the term "bias trace" includes any bias traces, such as ground and/or power and/or voltage potential traces.

In contrast, embedded signal trace 210 is electrically connected to an electrical signal source. The electrical signal source provides an electrical signal, e.g., representing data, on embedded signal trace 210. Accordingly, the term "signal trace" includes any trace capable of conducting, transmitting, propagating, or otherwise carrying or transferring an electrical signal or data.

Embedded signal trace 210 is positioned horizontally between first embedded bias trace 208A and second embedded bias trace 208B. Accordingly, embedded signal trace 210 is horizontally shielded in both directions by embedded bias traces 208.

In one embodiment, embedded circuit pattern 206 is formed using a laser-ablation process, such as that set forth in Huemoeller et al., U.S. patent application Ser. No. 11/543, 540, cited above. Illustratively, laser-ablated artifacts are formed in dielectric layer 204 using a laser-ablation process. These laser-ablated artifacts are filled with one or more layers of electrically conductive material to form embedded circuit pattern 206.

Using laser-ablation techniques to form the laser-ablated artifacts, the depth, width, shape, and horizontal displacement of the laser-ablated artifacts, e.g., bias/signal trace trenches and land openings, can be controlled extremely accurately. Therefore, the horizontal distance between embedded bias traces 208 and embedded signal trace 210 eventually formed in the laser-ablated artifacts is very accurately controlled. Accordingly, the signal control impedance of embedded signal trace 210 provided by embedded bias traces 208 is very accurately controlled. In addition, the depth of embedded bias traces 208 is also very accurately controlled for better, and more accurate, signal shielding of embedded signal trace 210. Consequently, the ability to accurately control the electrical properties of embedded signal trace 210, and generally embedded circuit pattern 206, is maximized.

Figure 5:
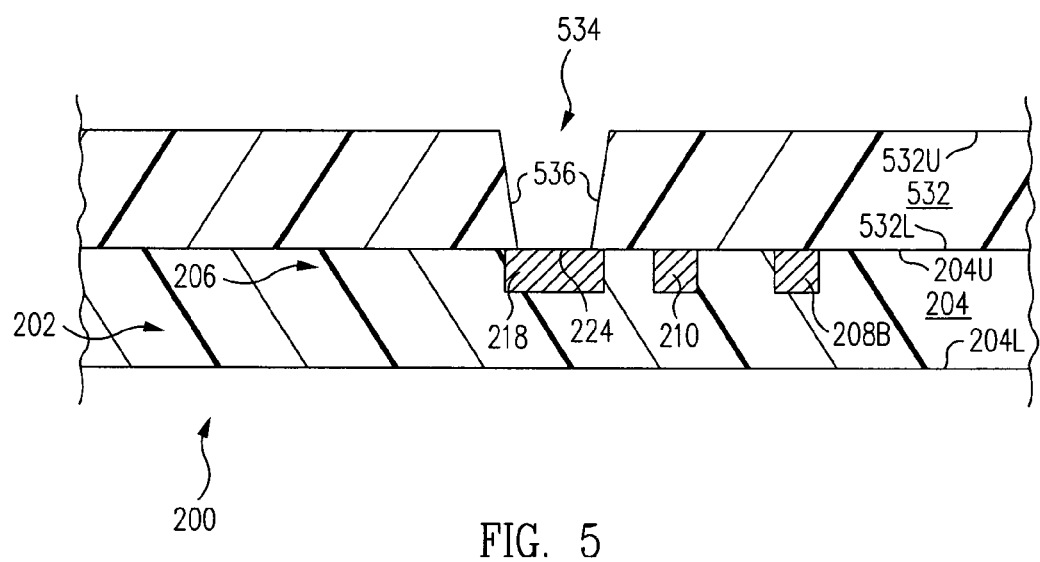
FIG. 5 is a cross-sectional view of the package of FIG. 4 at a further stage during fabrication in accordance with one embodiment.

FIG. 5 is a cross-sectional view of package 200 of FIG. 4 at a further stage during fabrication in accordance with one embodiment. Referring now to FIGS. 1 and 5 together, from form embedded bias-signal trace structure operation 102, flow moves to a mount buildup dielectric operation 104. In mount buildup dielectric operation 104, a buildup dielectric layer 532 is mounted to embedded bias-signal trace structure 202, i.e., to dielectric layer 204 and embedded circuit pattern 206. Generally, buildup dielectric layer 532 is mounted to dielectric layer 204 and over embedded circuit pattern 206.

More particularly, a lower, e.g., first, surface 532L of buildup dielectric layer 532 is mounted to upper surface 204U of dielectric layer 204. Buildup dielectric layer 532 further includes an upper, e.g., second, surface 532U opposite lower surface 532L.

From mount buildup dielectric operation 104, flow moves to a form bias via apertures in dielectric operation 106. In form bias via apertures in dielectric operation 106, bias via apertures (only a single bias via aperture 534 is illustrated in the view of FIG. 5) are formed in buildup dielectric layer 532, e.g., using a laser-ablation process. Accordingly, although only a single bias via aperture 534 is set forth below, in other examples, a plurality of bias via apertures are formed. The bias via apertures are formed where bias vias are electrically desired and/or where bias vias are determined by electrical simulations to reduce noise.

During the laser-ablation process, a laser beam is directed at buildup dielectric layer 532. The laser beam laser-ablates through buildup dielectric layer 532 to form bias via aperture 534.

In one embodiment, in addition to formation of bias via aperture 534, blind via apertures are formed to selectively expose embedded circuit pattern 206, e.g., embedded signal trace 210, during the laser-ablation process used during form bias via apertures in dielectric operation 106.

As illustrated in FIG. 5, in one embodiment, bias via aperture 534 has a taper profile with the greatest width at upper surface 532U of buildup dielectric layer 532 due to the laser-ablation process.

Bias via aperture 534 is an opening (aperture) extending entirely through buildup dielectric layer 532 to embedded land 218 in a direction perpendicular to upper surface 532U of buildup dielectric layer 532. Embedded land 218, i.e., land primary surface 224 of embedded land 218, is exposed through bias via aperture 534. Bias via aperture 534 is defined by a bias via aperture sidewall 536.

Figure 6:
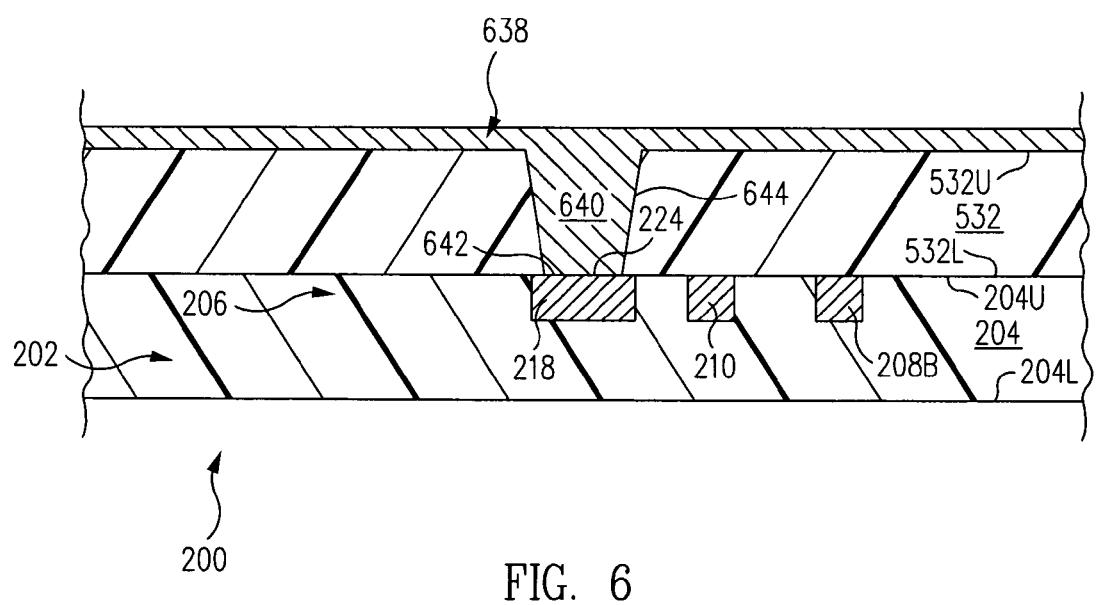
FIGS. 6, 7, and 8 are cross-sectional views of the package of FIG. 5 at further stages during fabrication in accordance with various embodiments.

FIG. 6 is a cross-sectional view of package 200 of FIG. 5 at a further stage during fabrication in accordance with one embodiment. Referring now to FIGS. 1, 5 and 6 together, from form bias via apertures in dielectric operation 106, flow moves to a fill bias via apertures with electrically conductive material to form bias vias operation 108. In fill bias via apertures with electrically conductive material to form bias vias operation 108, the bias via apertures, e.g., bias via aperture 534, are filled with an electrically conductive material 638, e.g., copper, to form bias vias, e.g., bias via 640.

Bias via 640 extends between upper surface 532U and lower surface 532L of buildup dielectric layer 532. Bias via 640 is electrically connected to embedded land 218 and thus embedded bias trace 208A (embedded bias trace 208A is not illustrated in FIG. 6, see for example, FIGS. 1 and 2).

As mentioned above, in one embodiment, embedded land 218 is not formed. In accordance with this embodiment, bias via 640 is directly electrically connected to embedded bias trace 208A.

Bias via 640 includes a bias via base 642 and a bias via sidewall 644. Bias via base 642 is coplanar with lower surface 532L of buildup dielectric layer 532 and formed directly on embedded land 218, i.e., on land primary surface 224. Bias via sidewall 644 extends from bias via base 642 entirely through buildup dielectric layer 532 in a direction perpendicular to upper surface 532U of buildup dielectric layer 532.

In the above manner, bias vias such as bias via 640 are created at critical junctions to reduce noise on power return paths. Further, formation of a ground plane layer is avoided further reducing noise and minimizing fabrication cost. This also enables high frequency signal propagation without formation of a ground plane layer.

In one embodiment, in addition to formation of bias via 640, blind vias are formed to selectively electrically connect to embedded circuit pattern 206, e.g., to embedded signal trace 210. The blind vias are formed by plating blind via apertures during the plating used during fill bias via apertures with electrically conductive material to form bias vias operation 108.

Figure 7:
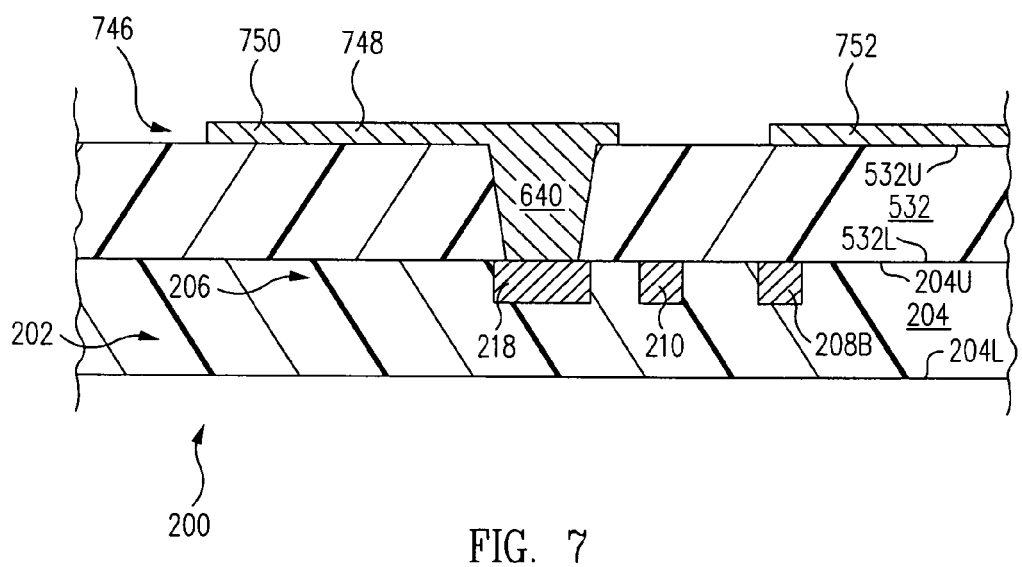

FIG. 7 is a cross-sectional view of package 200 of FIG. 6 at a further stage during fabrication in accordance with one embodiment. Referring now to FIGS. 1, 6 and 7 together, from fill bias via apertures with electrically conductive material to form bias vias operation 108, flow moves to a pattern electrically conductive material to form buildup circuit pattern operation 110. In pattern electrically conductive material to form buildup circuit pattern operation 110, electrically conductive material 638 (FIG. 6) is patterned to form a buildup circuit pattern 746 (FIG. 7). Electrically conductive material 638 is patterned using any one of a number of patterning techniques, such as a selective etching or laser-ablation process, and the particular technique used is not essential to this embodiment.

Buildup circuit pattern 746 is formed on upper surface 532U of buildup dielectric layer 532. Buildup circuit pattern 746 includes electrically conductive features such as a buildup bias trace 748, a buildup land 750, and a buildup signal trace 752, although includes other features in other examples.

Buildup bias trace 748 is electrically connected to bias via 640 and thus to bias trace 208A.

Figure 8:
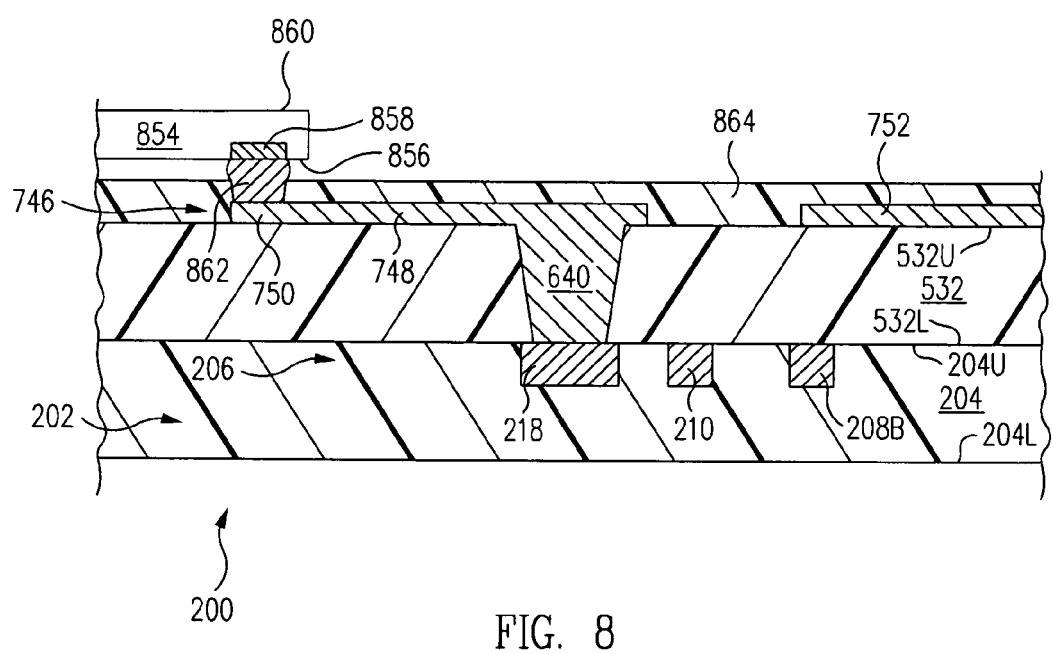

FIG. 8 is a cross-sectional view of package 200 of FIG. 7 at a further stage during fabrication in accordance with one embodiment. Referring now to FIGS. 1 and 8 together, from pattern electrically conductive material to form buildup circuit pattern operation 110, flow moves to a mount additional structures operation 112. In mount additional structures operation 112, one or more electronic structures 854 are mounted and electrically connected to buildup circuit pattern 746.

Illustratively, electronic structure 854 is an integrated circuit die, a passive component, an interposer, a package, or other electronic structure. For simplicity of discussion, electronic structure 854 shall be referred to as integrated circuit die 854.

Integrated circuit die 854 includes an active surface 856 having bond pads 858, sometimes called terminals, formed thereon. Integrated circuit die 854 further includes an inactive surface 860.

Bond pads 858 are physically and electrically flip chip connected to buildup lands 750 of buildup circuit pattern 746 by electrically conductive bumps 862, e.g., flip chip bumps. In one embodiment, an insulating layer 864, e.g., a solder mask, is selectively applied prior to mounting of integrated circuit die 854 to protect buildup circuit pattern 746.

In another embodiment, integrated circuit die 854 is mounted in a wirebond configuration instead of the flip chip configuration illustrated in FIG. 8. In accordance with this embodiment, inactive surface 860 is mounted to upper surface 532U of buildup dielectric layer 532 (and/or insulating layer 864) by a die attach adhesive. Bond pads 858 are electrically connected to buildup lands 750 of buildup circuit pattern 746 by bond wires. Other mounting configurations are possible.

Figure 9:
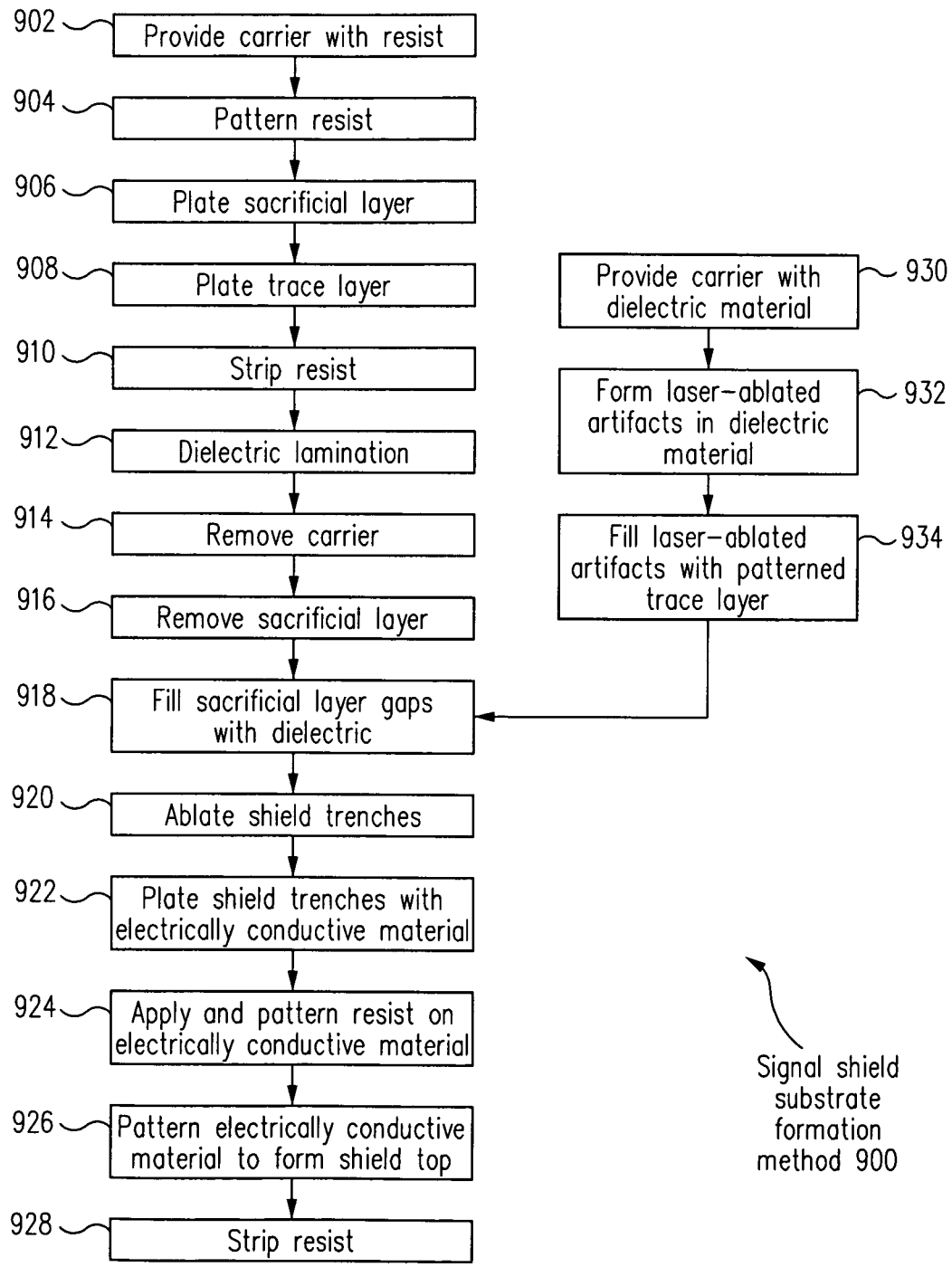
FIG. 9 is a signal shield substrate formation method in accordance with one embodiment of the present invention.
Figure 10:
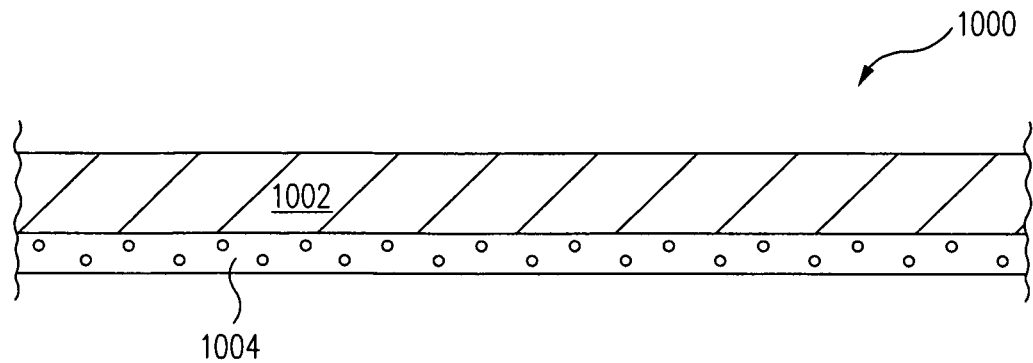
FIG. 10 is a cross-sectional view of a signal shield substrate in accordance with one embodiment of the present invention.

FIG. 9 is a signal shield substrate formation method 900 in accordance with one embodiment of the present invention. FIG. 10 is a cross-sectional view of a signal shield substrate 1000 in accordance with one embodiment of the present invention. FIGS. 11, 12, 13, 14, 15, 16, 17, 18, 19, and 20 are cross-sectional views of signal shield substrate 1000 of FIG. 10 at further stages during fabrication in accordance with various embodiments.

Referring now to FIGS. 9 and 10 together, in a provide carrier with resist operation 902, signal shield substrate 1000 including an upper, e.g., first, carrier 1002 and a photoresist layer 1004 is provided.

Upper carrier 1002 is an electrically conductive material, e.g., copper. Photoresist layer 1004 is a layer of photoresist, e.g., positive or negative photoresist, on carrier 1002.

Figure 11:
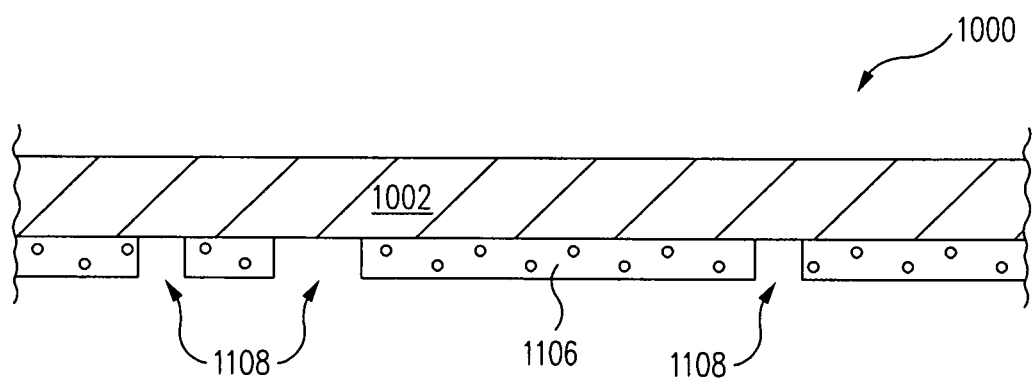
FIGS. 11, 12, 13, 14, 15, 16, 17, 18, 19, and 20 are cross-sectional views of the signal shield substrate of FIG. 10 at further stages during fabrication in accordance with various embodiments.

Referring now to FIGS. 9, 10 and 11 together, from provide carrier with resist operation 902, flow moves to a pattern resist operation 904. In pattern resist operation 904, photoresist layer 1004 of signal shield substrate 1000 of FIG. 10 is patterned to form a patterned photoresist layer 1106 as illustrated in FIG. 11. Photoresist layer 1004 is patterned using laser-ablation in one embodiment. In another embodiment, a photolithography process is used including use of laser direct imaging.

Photoresist layer 1004 is patterned to expose portions of upper carrier 1002. More particularly, photoresist layer 1004 is patterned to form circuit pattern artifacts 1108, i.e., openings, within photoresist layer 1004. Stated another way, patterned photoresist layer 1106 includes circuit pattern artifacts 1108. Upper carrier 1002 is exposed through circuit pattern artifacts 1108.

Illustratively, circuit pattern artifacts 1108 include trace channels and land apertures in which traces and lands are formed as discussed below.

Figure 12:
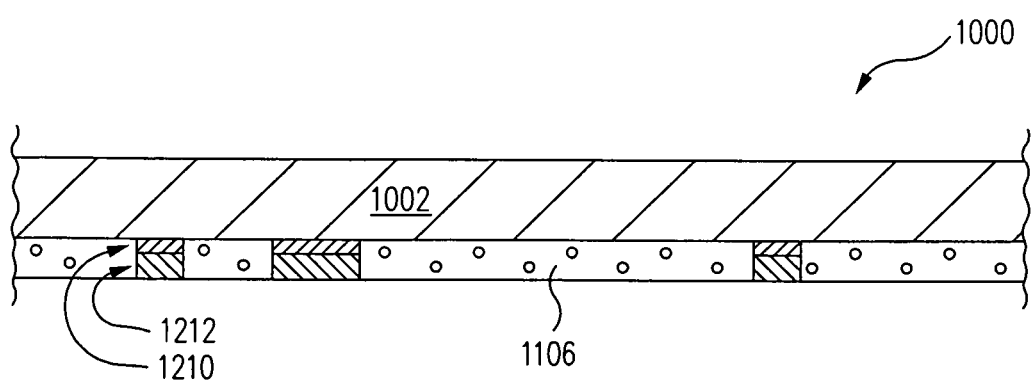

Referring now to FIGS. 9 and 12 together, from pattern resist operation 904, flow moves to a plate sacrificial layer operation 906. In plate sacrificial layer operation 906, a patterned sacrificial layer 1210 of a sacrificial metal is plated within circuit pattern artifacts 1108 of patterned photoresist layer 1106.

From plate sacrificial layer operation 906, flow moves to a plate trace layer operation 908. In plate trace layer operation 908, a patterned trace layer 1212 of a conductor metal is plated on patterned sacrificial layer 1210 within circuit pattern artifacts 1108 of patterned photoresist layer 1106. Patterned trace layer 1212 defines circuit traces, e.g., bias traces and/or signal traces, and/or lands in one embodiment.

In one embodiment, the sacrificial metal, e.g., nickel, tin, gold, or palladium, of patterned sacrificial layer 1210 is selectively etchable compared to the conductor metal, e.g., copper, silver, or solder, of patterned trace layer 1212.

In accordance with one embodiment, carrier 1002 is used as the electrode for electroplating of patterned sacrificial layer 1210 and patterned trace layer 1212. Patterned sacrificial layer 1210 and patterned trace layer 1212 are electroplated using carrier 1002 as the electrode using any one of a number of electroplating techniques well known to those of skill in the art, and the particular technique used is not essential to this embodiment.

Figure 13:
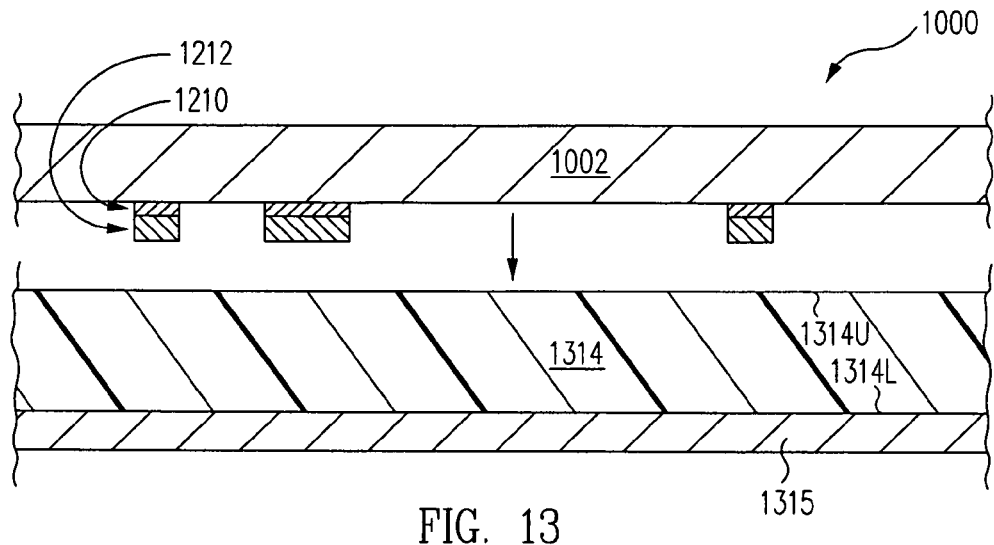

Referring now to FIGS. 9, 12 and 13 together, from plate trace layer operation 908, flow moves to a strip resist operation 910. In strip resist operation 910, patterned photoresist layer 1106 is stripped, i.e., removed. Patterned photoresist layer 1106 is stripped using any one of a number of photoresist stripping techniques well known to those of skill in the art, the particular technique used is not essential to this embodiment.

Thus, as shown in FIG. 13, after removal of patterned photoresist layer 1106, patterned sacrificial layer 1210 and patterned trace layer 1212 remain on carrier 1002.

Figure 14:
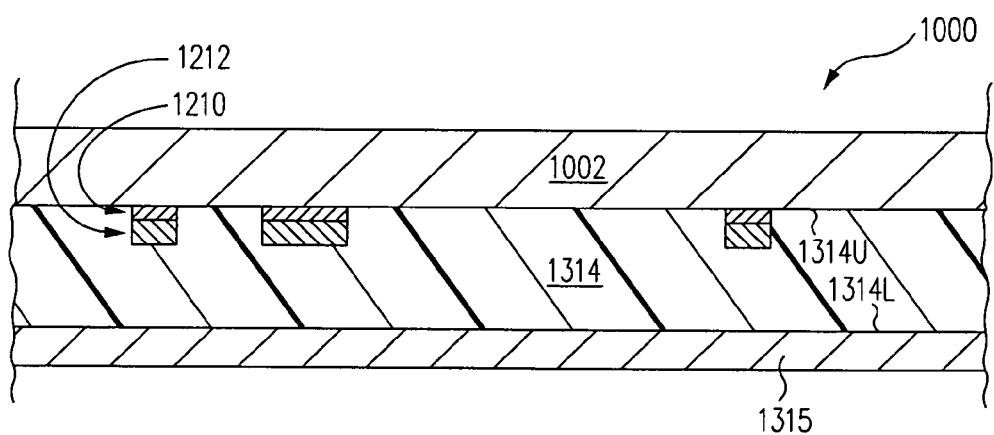

Referring now to FIGS. 9, 13 and 14 together, from strip resist operation 910, flow moves to a dielectric lamination operation 912. In dielectric lamination operation 912, patterned sacrificial layer 1210 and patterned trace layer 1212 are laminated to a dielectric material 1314.

More particularly, as shown in FIG. 14, patterned sacrificial layer 1210 and patterned trace layer 1212 are laminated into an upper, e.g., first, surface 1314U of dielectric material 1314.

Dielectric material 1314 further includes a lower, e.g., second, surface 1314L, opposite upper surface 1314U. Lower surface 1314L is mounted to a lower, e.g., second, carrier 1315. Lower carrier 1315 is an electrically conductive material, e.g., copper.

Dielectric material 1314 is glass impregnated resin, e.g., printed circuit board material, dielectric film, epoxy, or other dielectric material. In one embodiment, dielectric material 1314 is a reinforced dielectric providing structural integrity to signal shield substrate 1000.

In accordance with one embodiment, carrier 1002 including patterned sacrificial layer 1210 and patterned trace layer 1212 are placed on upper surface 1314U of dielectric material 1314. The assembly is heated while carrier 1002 including patterned sacrificial layer 1210 and patterned trace layer 1212 are pressed into dielectric material 1314. This can be accomplished by full press or tack lamination process.

Due to the heat and pressure, dielectric material 1314 is caused to flow around patterned sacrificial layer 1210 and patterned trace layer 1212 to carrier 1002. Generally, dielectric material 1314 flows to encapsulate patterned sacrificial layer 1210 and patterned trace layer 1212 within dielectric material 1314 such that dielectric material 1314 contacts carrier 1002 in the spaces between patterned sacrificial layer 1210 and patterned trace layer 1212 as shown in FIG. 14.

Figure 15:
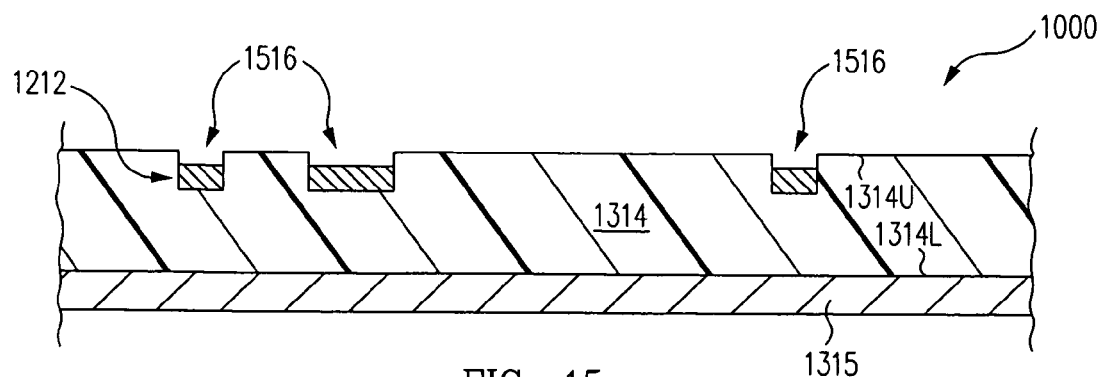

Referring now to FIGS. 9, 14 and 15 together, from dielectric lamination operation 912, flow moves to a remove carrier operation 914. In remove carrier operation 914, carrier 1002 is removed, e.g., using a carrier etch process or peeled. In one embodiment, carrier 1002 is copper and is removed using a copper etch process as the carrier etch process. During this copper etch process, patterned sacrificial layer 1210 provide an etch stop for the copper etch process.

In one embodiment, an etch stop is an etch process end point. To illustrate, the copper etch process is performed until carrier 1002 is completely removed, which is the process end point. More particularly, upon complete removal of carrier 1002, patterned sacrificial layer 1210 becomes exposed and prevents further etching during the copper etch process.

From remove carrier operation 914, flow moves to a remove sacrificial layer operation 916. In remove sacrificial layer operation 916, patterned sacrificial layer 1210 is removed, e.g., using a sacrificial layer etch process. During this sacrificial layer etch process, patterned trace layer 1212 provide an etch stop for the sacrificial layer etch process.

To illustrate, the sacrificial layer etch process is performed until patterned sacrificial layer 1210 is completely removed, which is the process end point. More particularly, upon complete removal of patterned sacrificial layer 1210, patterned trace layer 1212 becomes exposed and prevents further etching during the sacrificial layer etch process.

Removal of patterned sacrificial layer 1210 creates sacrificial layer gaps 1516, i.e., openings, in signal shield substrate 1000. More particular, sacrificial layer gaps 1516 are formed above patterned trace layer 1212 and within dielectric material 1314.

Figure 16:
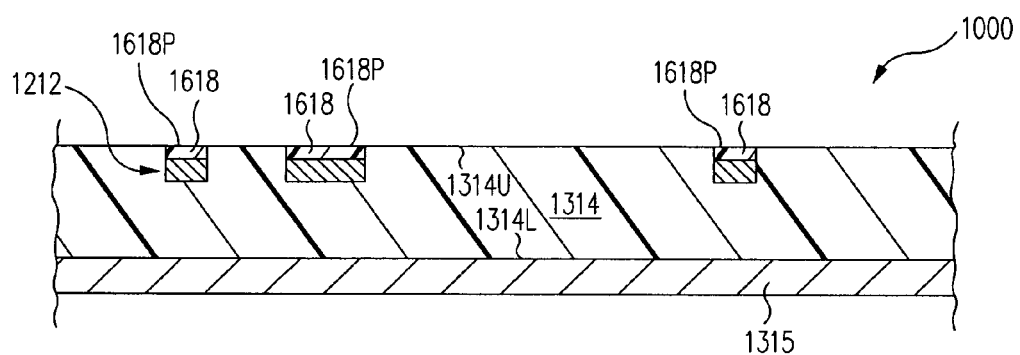

Referring now to FIGS. 9, 15 and 16 together, from remove sacrificial layer operation 916, flow moves to a fill sacrificial layer gaps with dielectric operation 918. In fill sacrificial layer gaps with dielectric operation 918, sacrificial layer gaps 1516 are filled with a trace layer isolation dielectric material 1618. Accordingly, patterned trace layer 1212 is encapsulated within and electrically isolated by dielectric material 1314 and trace layer isolation dielectric material 1618.

Sacrificial layer gaps 1516 are filled with trace layer isolation dielectric material 1618 using any one of a number of techniques and the particular technique used is not essential. In accordance with one embodiment, trace layer isolation dielectric material 1618 completely fills sacrificial layer gaps 1516 such that a primary surface 1618P of trace layer isolation dielectric material 1618 is coplanar with upper surface 1314U of dielectric material 1314.

Figure 17:
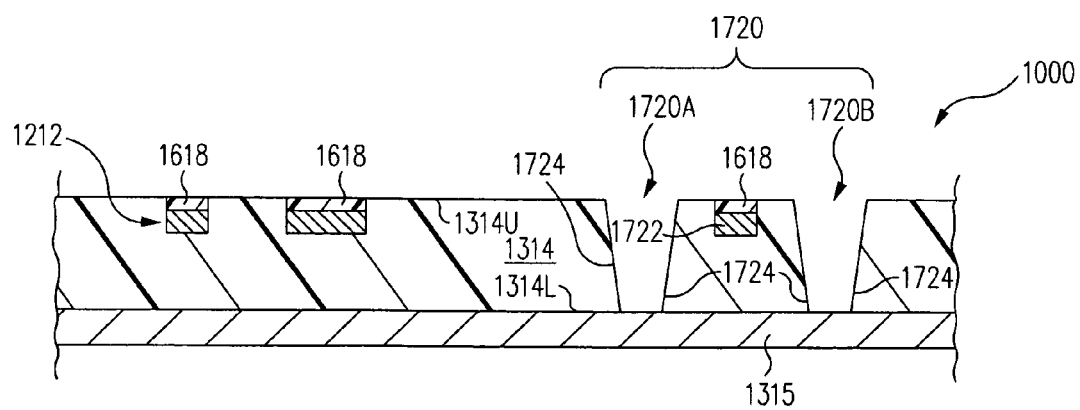

Referring now to FIGS. 9 and 17 together, from fill sacrificial layer gaps with dielectric operation 918, flow moves to an ablate shield trenches operation 920. In ablate shield trenches operation 920, shield trenches 1720 are formed in signal shield substrate 1000, e.g., using laser-ablation.

As illustrated in FIG. 17, shield trenches 1720 extend from upper surface 1314U of dielectric material 1314 and through dielectric material 1314 to lower carrier 1315. Shield trenches 1720 have a taper profile with the greatest width at upper surface 1314U of dielectric material 1314 due to the laser-ablation process.

In accordance with the embodiment illustrated in FIG. 17, first and second shield trenches 1720A, 1720B of the plurality of shield trenches 1720 are formed on opposite sides of a signal trace 1722 of patterned trace layer 1212. More particularly, signal trace 1722 is located horizontally between shield trenches 1720A, 1720B. Signal trace 1722 is horizontally separated from shield trenches 1720A, 1720B by dielectric material 1314.

Shield trenches 1720A, 1720B are defined by shield trench sidewalls 1724. Shield trench sidewalls 1724 extend entirely through dielectric material 1314 between upper surface 1314U and lower surface 1314L of dielectric material 1314.

Figure 18:
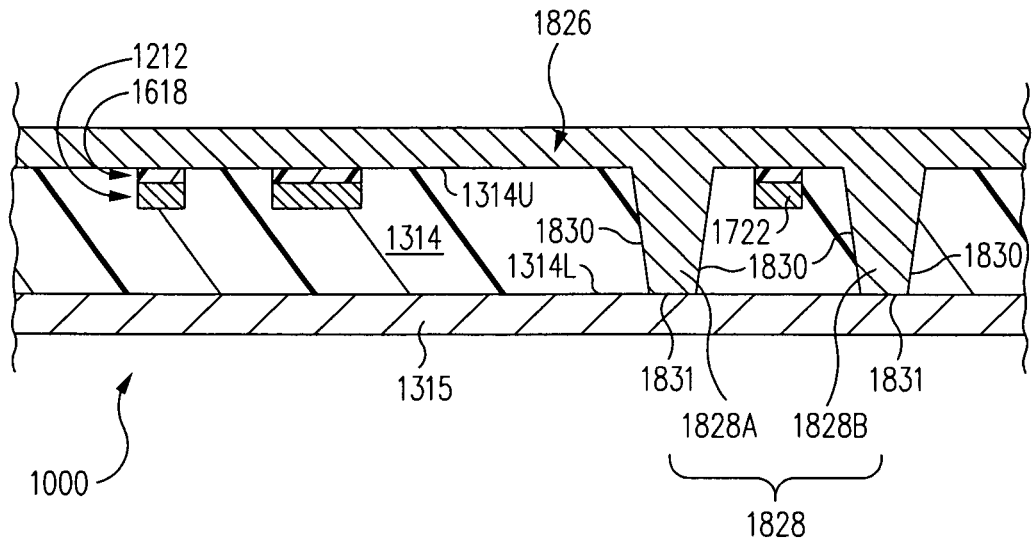

Referring now to FIGS. 9, 17 and 18 together, from ablate shield trenches operation 920, flow moves to a plate shield trenches with electrically conductive material operation 922. In plate shield trenches with electrically conductive material operation 922, shield trenches 1720 are plated, i.e., filled, with an electrically conductive material 1826 forming shield walls 1828 within shield trenches 1720.

As illustrated FIG. 18, shield walls 1828 extend from upper surface 1314U of dielectric material 1314 and through dielectric material 1314 to lower carrier 1315. Accordingly, shield walls 1828 are electrically connected to lower carrier 1315.

In accordance with the embodiment illustrated in FIG. 18, first and second shield walls 1828A, 1828B of the plurality of shield walls 1828 are formed on opposite sides of signal trace 1722 of patterned trace layer 1212. More particularly, signal trace 1722 is located horizontally between shield walls 1828A, 1828B. Signal trace 1722 is electrically isolated from shield walls 1828A, 1828B by dielectric material 1314.

Shield walls 1828A, 1828B include shield wall sides 1830. Shield wall sides 1830 extend entirely through dielectric material 1314 between upper surface 1314U and lower surface 1314L of dielectric material 1314. Shield walls 1828A, 1828B also include shield wall lower, e.g., first, surfaces 1831, in contact with and formed on lower carrier 1315.

Although electrically conductive material 1826 is illustrated as a single layer conductor, in other embodiments, electrically conductive material 1826 is a multi-layer structure, e.g., includes an electrically conductive seed layer and an electrically conductive material plated on the seed layer.

In addition to filling shield trenches 1720, electrically conductive material 1826 extends over and is formed on upper surface 1314U of dielectric material 1314 and also on trace layer isolation dielectric material 1618. Trace layer isolation dielectric material 1618 is between patterned trace layer 1212 including signal trace 1722 and electrically conductive material 1826 thereby electrically isolating patterned trace layer 1212 from electrically conductive material 1826.

Figure 19:
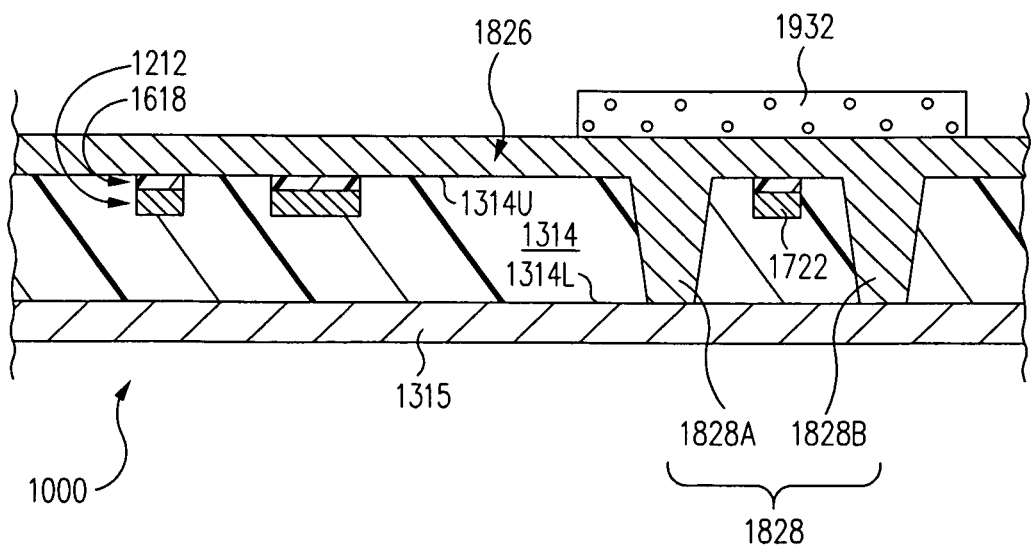

Referring now to FIG. 19, from plate shield trenches with electrically conductive material operation 922, flow moves to an apply and pattern resist on electrically conductive material operation 924. In apply and pattern resist on electrically conductive material operation 924, a photoresist layer is applied to electrically conductive material 1826 and patterned to form a patterned photoresist layer 1932 on electrically conductive material 1826 as illustrated in FIG. 19. Portions of electrically conductive material 1826 are exposed by patterned photoresist layer 1932.

In one embodiment, the photoresist layer is patterned using laser-ablation to form patterned photoresist layer 1932. In another embodiment, a photolithography process is used including use of laser direct imaging.

Figure 20:
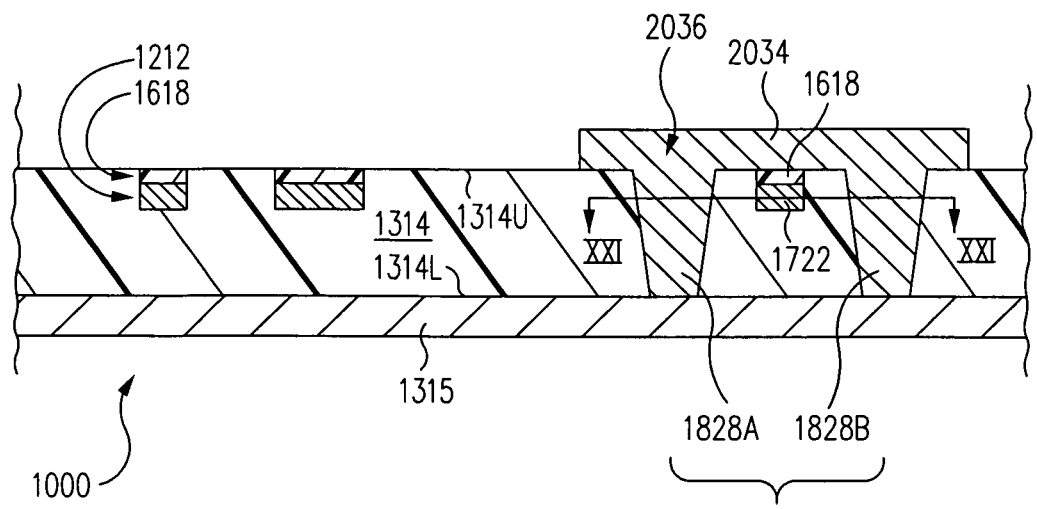

Referring now to FIGS. 9, 19 and 20 together, from apply and pattern resist on electrically conductive material operation 924, flow moves to a pattern electrically conductive material to form shield top operation 926. In pattern electrically conductive material to form shield top operation 926, electrically conductive material 1826 is patterned using patterned photoresist layer 1932 to form a shield top 2034 as illustrated in FIG. 20. In one embodiment, the exposed portions of electrically conductive material 1826 are removed, e.g., with an etch process using patterned photoresist layer 1932 as a mask. The remaining portion(s) of electrically conductive material 1826 covered by patterned photoresist layer 1932 form shield top 2034.

Shield top 2034 extends horizontally between shield walls 1828A, 1828B and over signal trace 1722 in a plane parallel with upper surface 1314U of dielectric material 1314. Shield top 2034 is electrically connected to shield walls 1828A, 1828B. Further, shield top 2034 is separated and electrically isolated from signal trace 1722 by trace layer isolation dielectric material 1618.

From pattern electrically conductive material to form shield top operation 926, flow moves to a strip resist operation 928. In strip resist operation 928, patterned photoresist layer 1932 is stripped, i.e., removed. Patterned photoresist layer 1932 is stripped using any one of a number of photoresist stripping techniques well known to those of skill in the art, the particular technique used is not essential to this embodiment.

Thus, as shown in FIG. 20, after removal of patterned photoresist layer 1932, shield top 2034 remains on dielectric material 1314 and trace layer isolation dielectric material 1618.

In one embodiment, lower carrier 1315 is patterned in a similar manner to form a shield bottom similar to shield top 2034. In another embodiment, lower carrier 1315 forms the shield bottom, e.g., a ground plane. Signal shield substrate 1000 is used or further processed to form an electronic component package, e.g., by mounting and electrically connecting one or more electronic components to signal shield substrate 1000.

Figure 21:
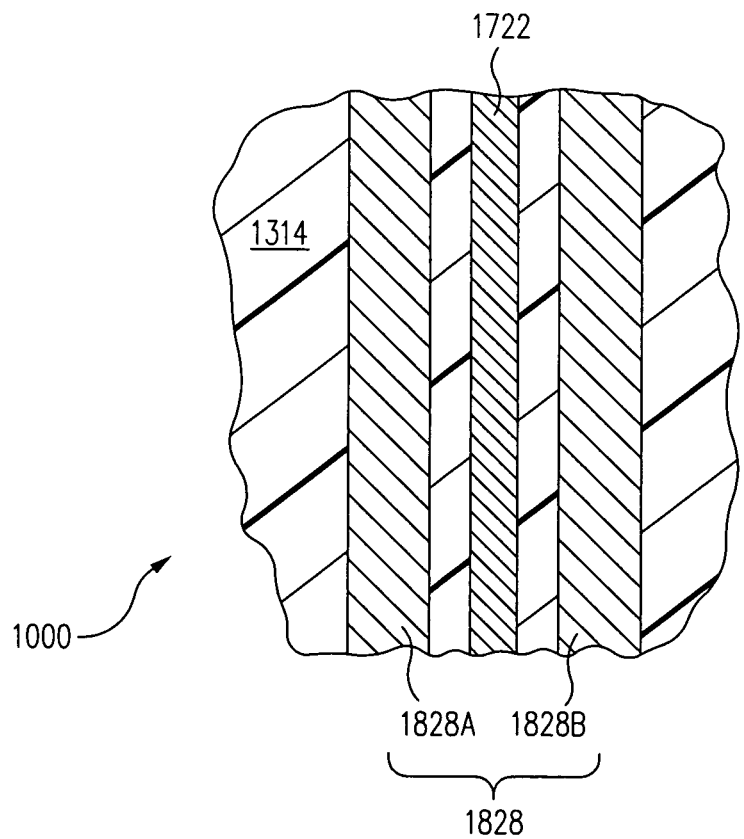
FIG. 21 is a cross-sectional view of the signal shield substrate along the line XXI-XXI of FIG. 20 in accordance with one embodiment.

FIG. 21 is a cross-sectional view of signal shield substrate 1000 along the line XXI-XXI of FIG. 20 in accordance with one embodiment. Referring now to FIGS. 20 and 21 together, signal trace 1722 is completely shielded. More particularly, signal trace 1722 is shielded from above by shield top 2034. Signal trace 1722 is shielded from the sides by shield walls 1828A, 1828B. Further, signal trace 1722 is shielded from below by lower carrier 1315.

More particularly, shield top 2034, shield walls 1828A, 1828B and lower carrier 1315 form a bias shield 2036 around signal trace 1722. Bias shield 2036 is electrically connected to a reference voltage source, e.g., ground or power. Accordingly, signals propagated on signal trace 1722 are shielded by bias shield 2036.

In this manner, noise, signal attenuation, and signal coupling to non-critical planes, on signal trace 1722 is minimized enabling high frequency signal propagation on signal trace 1722 without addition of a ground layer. Further, impedance of signal trace 1722 is carefully controlled.

Figure 22:
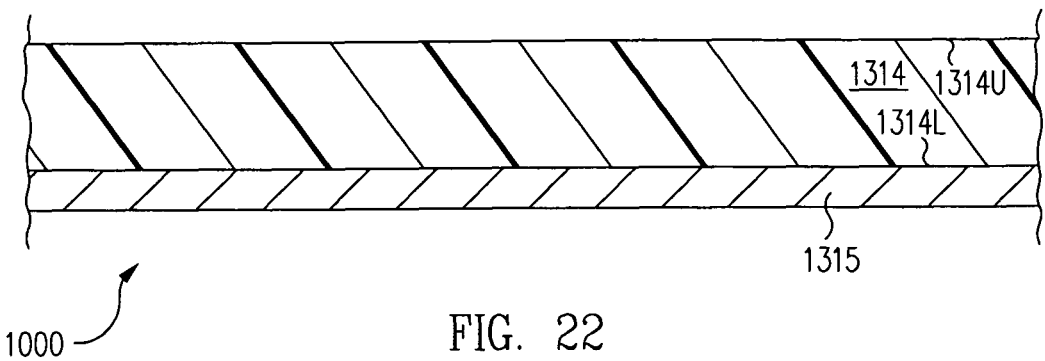
FIG. 22 is a cross-sectional view of a signal shield substrate in accordance with an alternative embodiment.

FIG. 22 is a cross-sectional view of signal shield substrate 1000 in accordance with an alternative embodiment. Referring now to FIGS. 9 and 22 together, in accordance with this embodiment, in a provide carrier with dielectric material operation 930, dielectric material 1314 is provided on lower carrier 1315 as illustrated in FIG. 22. Dielectric material 1314 and lower carrier 1315 are described above.

Figure 23:
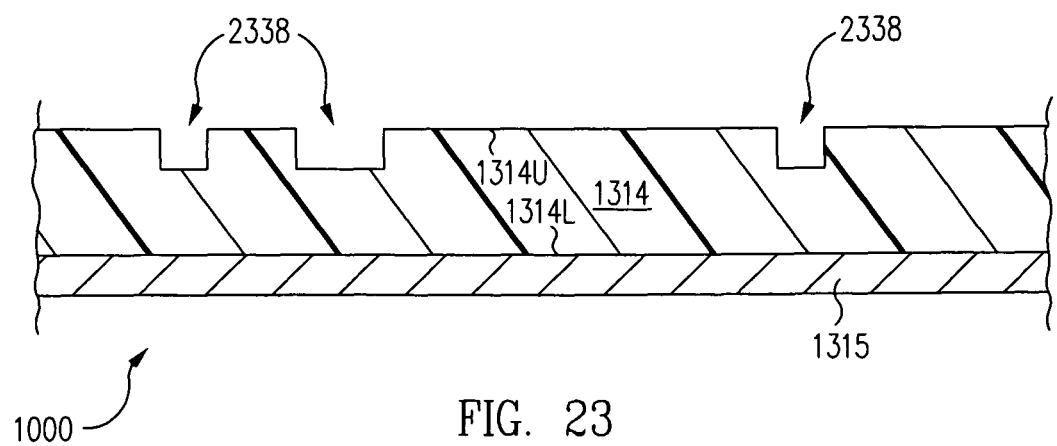
FIG. 23 is a cross-sectional view of the signal shield substrate of FIG. 22 at a later stage during fabrication in accordance with one embodiment.

FIG. 23 is a cross-sectional view of signal shield substrate 1000 of FIG. 22 at a later stage during fabrication in accordance with one embodiment. Referring now to FIGS. 9 and 23 together, from provide carrier with dielectric material operation 930, flow moves to a form laser-ablated artifacts in dielectric material operation 932. In form laser-ablated artifacts in dielectric material operation 932, laser-ablated artifacts 2338 are formed in dielectric material 1314 using a laser-ablation process. Laser-ablated artifacts 2338 include trace channels and land apertures.

Referring now to FIGS. 9, 15 and 23 together, from form laser-ablated artifacts in dielectric material operation 932, flow moves to a fill laser-ablated artifacts with patterned trace layer operation 934. In fill laser-ablated artifacts with patterned trace layer operation 934, laser-ablated artifacts 2338 are filled with electrically conductive material to form patterned trace layer 1212 embedded within dielectric material 1314 as illustrated in FIG. 15. In one embodiment, the electrically conductive material is plated within laser-ablated artifacts 2338 and then over etched to create gaps (corresponding to sacrificial layer gaps 1516 illustrated FIG. 15) above patterned trace layer 1212.

Referring now to FIG. 9, from fill laser-ablated artifacts with patterned trace layer operation 934, flow moves to fill sacrificial layer gaps with dielectric operation 918, which is performed as discussed above.

Although formation of individual packages and/or substrates is described above, in other embodiments, a plurality of packages and/or substrates are formed simultaneously in an array using the methods as described above. The array is singulated to singulate the individual packages and/or substrates from one another.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. A method comprising:
    providing a first embedded bias trace embedded within a substrate material;
    providing an embedded signal trace embedded within the substrate material;
    mounting a first surface of a buildup dielectric layer to the substrate material;
    forming a bias via aperture within the buildup dielectric layer, the bias via aperture extending entirely through the buildup dielectric layer;
    filling the bias via aperture with an electrically conductive material to form a bias via, the bias via electrically connected to the first embedded bias trace; and
    patterning the electrically conductive material to form a buildup circuit pattern, the buildup circuit pattern being formed on a second surface of the buildup dielectric layer opposite the first surface of the buildup dielectric layer,
    wherein said providing a first embedded bias trace embedded within a substrate material comprises:
        forming a first bias trace void in the substrate material in which the first embedded bias trace is to be formed; and
        after said forming the first bias trace void, filling at least a portion of the first bias trace void with conductive material.

2. The method of claim 1 further comprising electrically connecting an electronic component structure to the buildup circuit pattern.

3. A method comprising:
    providing a first embedded bias trace embedded within a substrate material;
    providing an embedded signal trace embedded within the substrate material;
    mounting a buildup dielectric layer to the substrate material;
    forming a bias via aperture within the buildup dielectric layer, the bias via aperture extending entirely through the buildup dielectric layer; and
    filling the bias via aperture with an electrically conductive material to form a bias via, the bias via electrically connected to the first embedded bias trace, wherein the first embedded bias trace is electrically connected to and in direct contact with an embedded land embedded within the substrate material,
    wherein said providing a first embedded bias trace embedded within a substrate material comprises:
        forming a first bias trace void in the substrate material in which the first embedded bias trace is to be formed; and
        after said forming the first bias trace void, filling at least a portion of the first bias trace void with conductive material.

4. The method of claim 3 further comprising providing a second embedded bias trace embedded within the substrate material, where the embedded signal trace is positioned between the first embedded bias trace and the second embedded bias trace.

5. The method of claim 1 wherein:
    the substrate material comprises a first substrate surface, in which the first embedded bias trace and the embedded signal trace are embedded, and a second substrate surface opposite the first substrate surface; and
    the first embedded bias trace and the embedded signal trace extend only partially through the substrate material between the first substrate surface and the second substrate surface.

6. The method of claim 1, wherein the substrate material comprises a first substrate surface, in which the first embedded bias trace and the embedded signal trace are embedded, and a second substrate surface opposite the first substrate surface.

7. The method of claim 6, wherein the first embedded bias trace comprises a bias trace primary surface coplanar with the first substrate surface.

8. The method of claim 6, wherein the embedded signal trace comprises a signal trace primary surface coplanar with the first substrate surface.

9. The method of claim 1, wherein the substrate material comprises a prepreg material.

10. The method of claim 1, wherein said forming a bias via aperture comprises laser-ablating through the buildup dielectric layer.

11. A method comprising:
    providing an embedded bias-signal trace structure comprising:
        a substrate material;

a first embedded bias trace embedded within the substrate material; and
an embedded signal trace embedded within the substrate material;
mounting a first surface of a buildup dielectric layer to the embedded bias-signal trace structure;
forming a bias via aperture within the buildup dielectric layer, the bias via aperture extending entirely through the buildup dielectric layer;
filling the bias via aperture with an electrically conductive material to form a bias via, the bias via electrically connected to the first embedded bias trace; and
patterning the electrically conductive material to form a buildup circuit pattern, the buildup circuit pattern being formed on a second surface of the buildup dielectric layer opposite the first surface of the buildup dielectric layer,
wherein:
said forming a bias via aperture comprises forming the bias via aperture after said mounting a first surface of a buildup dielectric layer to the substrate material; and
said filling the bias via aperture comprises filling the bias via aperture after said forming a bias via aperture.

12. The method of claim 11 further comprising electrically connecting an electronic component structure to the buildup circuit pattern.

13. The method of claim 11, wherein the first embedded bias trace is electrically connected to a land embedded within the substrate material.

14. The method of claim 13, wherein the embedded bias-signal trace structure further comprises a second embedded bias trace embedded within the substrate material, and the embedded signal trace is positioned between the first embedded bias trace and the second embedded bias trace.

15. A method comprising:
providing a first embedded bias trace embedded within a substrate material at a first surface of the substrate material, wherein the first embedded bias trace comprises a bias trace primary surface coplanar with the first surface of the substrate material;
providing an embedded signal trace embedded within the substrate material at the first surface of the substrate material, wherein the embedded signal trace comprises a signal trace primary surface coplanar with the first surface of the substrate material;
mounting a first surface of a buildup dielectric layer to the first surface of the substrate material, to the bias trace primary surface, and to the signal trace primary surface;
forming a bias via aperture within the buildup dielectric layer, the bias via aperture extending entirely through the buildup dielectric layer; and
filling the bias via aperture with an electrically conductive material to form a bias via, the bias via electrically connected to the first embedded bias trace; and
patterning the electrically conductive material to form a buildup circuit pattern, the buildup circuit pattern being formed on a second surface of the buildup dielectric layer opposite the first surface of the buildup dielectric layer,
wherein said providing a first embedded bias trace embedded within a substrate material at a first surface of the substrate material comprises:
forming a first bias trace void in the first surface of the substrate material in which the first embedded bias trace is to be formed; and
after said forming the first bias trace void, filling at least a portion of the first bias trace void with conductive material.

16. The method of claim 15 further comprising providing a second embedded bias trace embedded within the substrate material at the first surface of the substrate material, where the embedded signal trace is positioned between the first embedded bias trace and the second embedded bias trace.

17. The method of claim 16 wherein the first embedded bias trace, the embedded signal trace, and the second embedded bias trace each comprise respective linear portions that run parallel to each other and parallel to the first surface of the substrate material.

18. The method of claim 11, wherein said providing an embedded bias-signal trace structure comprising a first embedded bias trace embedded within the substrate material comprises:
forming a first bias trace void in the substrate material in which the first embedded bias trace is to be formed; and
after said forming the first bias trace void, filling at least a portion of the first bias trace void with conductive material.

19. A method comprising:
providing a first embedded bias trace embedded within a substrate material;
providing an embedded signal trace embedded within the substrate material;
mounting a first surface of a buildup dielectric layer to the substrate material;
forming a bias via aperture within the buildup dielectric layer, the bias via aperture extending entirely through the buildup dielectric layer;
filling the bias via aperture with an electrically conductive material to form a bias via, the bias via electrically connected to the first embedded bias trace; and
patterning the electrically conductive material to form a buildup circuit pattern, the buildup circuit pattern being formed on a second surface of the buildup dielectric layer opposite the first surface of the buildup dielectric layer,
wherein:
said forming a bias via aperture comprises forming the bias via aperture after said mounting a first surface of a buildup dielectric layer to the substrate material; and
said filling the bias via aperture comprises filling the bias via aperture after said forming a bias via aperture.

20. A method comprising:
providing a first embedded bias trace embedded within a substrate material;
providing an embedded signal trace embedded within the substrate material;
mounting a first surface of a buildup dielectric layer to the substrate material;
forming a bias via aperture within the buildup dielectric layer, the bias via aperture extending entirely through the buildup dielectric layer;
filling the bias via aperture with an electrically conductive material to form a bias via, the bias via electrically connected to the first embedded bias trace;
patterning the electrically conductive material to form a buildup circuit pattern, the buildup circuit pattern being formed on a second surface of the buildup dielectric layer opposite the first surface of the buildup dielectric layer; and prior to performing said patterning and while performing said filling, forming the electrically conductive material on the buildup dielectric layer.

* * * * *